United States Patent [19]

Gouldy

[11] Patent Number: 4,872,937

[45] Date of Patent: Oct. 10, 1989

[54] ELECTRICAL COMPONENT AND METHOD OF MOUNTING SAME

[75] Inventor: Thomas E. Gouldy, South Williamsport, Pa.

[73] Assignee: GTE Products Corporation, Stamford, Conn.

[21] Appl. No.: 220,857

[22] Filed: Jul. 14, 1988

[51] Int. Cl.$^4$ ................................................ C09J 7/00
[52] U.S. Cl. ...................................... 156/313; 29/837; 361/400; 361/403; 428/317.3
[58] Field of Search ..................... 156/313; 428/317.3; 29/837; 361/403, 400

[56] References Cited

U.S. PATENT DOCUMENTS 3,704,515 12/1972 Nelson ................................ 156/249

FOREIGN PATENT DOCUMENTS 60-30331 2/1985 Japan .................................... 156/313

Primary Examiner—John J. Gallagher
Attorney, Agent, or Firm—William H. McNeill

[57] ABSTRACT

A mounting entity comprises, in layered order, a pressure sensitive adhesive, a foam spacer, a second pressure sensitive adhesive, a filler, and a heat sensitive adhesive. The first pressure sensitive adhesive is attached to an electrical component which is then mounted upon a printed circuit with the heat sensitive adhesive in contact therewith. The passing of the board over a solder wave heats the top surface of the board to a temperature high enough to activate the heat sensitive adhesive and adhere the component to the board. The intermediate foam layer dampens shock and vibration.

7 Claims, 1 Drawing Sheet

4,872,937

ELECTRICAL COMPONENT AND METHOD OF MOUNTING SAME

TECHNICAL FIELD

This invention relates to electrical components and mounting methods for them and more particularly to such components having a need to be mounted in a manner whereby mechanical dampening for shock and vibration is provided. Such a component can be a quartz crystal resonator.

BACKGROUND ART

Miniaturization trends in Electronics have begged solutions for mounting various large components.

Among these, quartz crystal resonators are among the most difficult due to their physical size in the most common frequency range of 3.0 MHz to 20.0 MHz. In addition, quartz crystal resonators mounted in positions other than the intended position require mechanical dampening for shock and vibration.

The current solution is to mount these devices horizontally. While this mounting scheme requires more P.C. board "Real Estate", the height is reduced by a factor of over 3 to 1. This allows for smaller overall assembly area and more compact designs.

When mounted horizontally, the device must be mechanically stabilized. There are currently two methods of mechanical stabilization: The first method incorporates a "third lead" welded on the top of the device; the second method uses double coated, pressure sensitive, foam tape.

The "third lead" method does not provide a cushion effect between the crystal and the P.C. board.

The double coated, pressure sensitive foam tape method provides the cushion effect, but requires an extra operation in production. Prior to mounting, the protective strip covering the adhesive must be removed to reveal the coated surface opposite the crystal so the assembly will adhere to the P.C. board. In addition, the heat of wave solder, in some instances, changes the chemical make-up of the glue, and the assembly no longer sticks to the P.C. Board, thereby destroying the cushioning effect.

SUMMARY OF THE INVENTION

It is, therefore, an object of the invention to obviate the disadvantages of the prior art.

It is another object of the invention to enhance electrical components and methods of mounting them.

These objects are achieved, in one aspect of the invention, by the provision of an electrical component which has a body having a major surface. A mounting entity for the component, whereby the component can be mounted, for example, to a printed circuit board, comprises, in layered order, a pressure sensitive adhesive, a resilient foam, and a heat sensitive adhesive. The pressure sensitive is affixed to the major surface of the component.

For mounting upon a printed circuit board, the component is positioned in a desired location on the board, usually by means of the component lead-ins penetrating the board and the heat sensitive adhesive in contact with its adjacent board surface. The temperature of the board surface is then raised to activate the heat sensitive adhesive in contact therewith. The component is thus mounted and provided with vibration resistance at the same time.

BEST MODE FOR CARRYING OUT THE INVENTION

For a better understanding of the present invention, together with other and further objects, advantages, and capabilities thereof, reference is made to the following disclosure and appended claims taken in conjunction with the above-described drawing.

Figure 1:
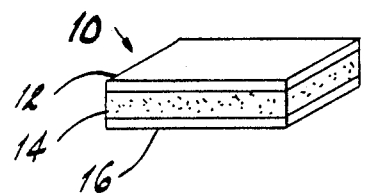
FIG. 1 is a perspective view of a preferred mounting entity.

Referring now to the drawings with greater particularity, there is shown in FIG. 1 a preferred mounting entity 10 which comprises, in layered order, a pressure sensitive adhesive 12, a flexible spacer 14, and a heat sensitive adhesive 16.

Figure 2:
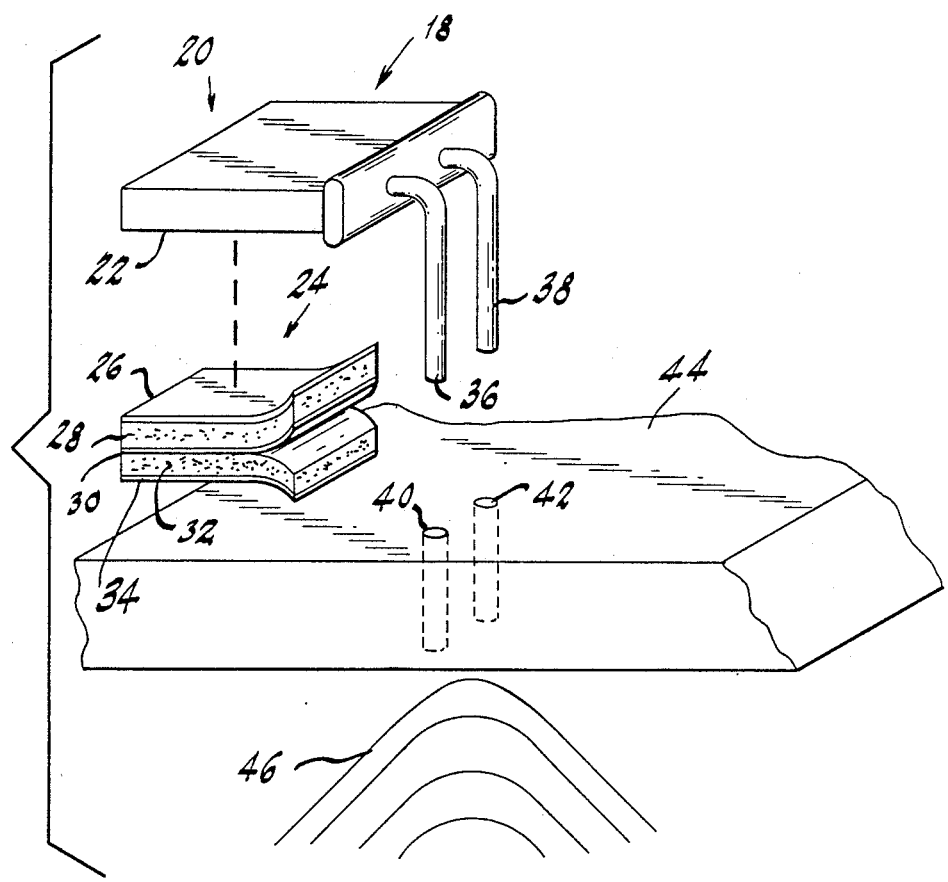
FIG. 2 is a perspective, exploded view of an alternate mounting entity, a component, a printed circuit board and a soldering technique.

In FIG. 2 is shown an electrical component 18, e.g., a quartz crystal resonator, having a body 20 with a major surface 22. An alternate mounting entity 24 comprises a first pressure sensitive adhesive 26 which attaches to major surface 22. A flexible spacer 28, which is preferably a cushioning foam layer which will provide a dampening effect, is attached to the first adhesive 26 and a second pressure adhesive 30 is attached to spacer 28. A filler layer 32 is attached to second adhesive 30 and a heat sensitive adhesive 34 is attached to the filler layer 32.

The component 18 has lead-ins 36, 38 which extend therefrom and are formed to provide at least a substantial part of their length orthogonal to the major surface 22.

The lead-ins 36 38 are inserted into apertures 40, 42 in a printed circuit board 44, after mounting entity 10 or 24 has been affixed, by pressure sensitive adhesive 12 or 26, to major surface 22.

With the component 18 in place on board 44, the board can be passed over a solder wave 46, as is conventional. The solder wave 46 will have a temperature of about 500° F. In such an instance, the temperature on the top of the board 44, which has the heat sensitive adhesive 16 or 34 in contact therewith, will reach a temperature of from about 150° F. to about 200° F., sufficient to activate adhesive 16 or 34 and bond it, and component 18, to the board.

The advantage of this procedure is that the component user can eliminate the step of removing a protective strip from a double-sided pressure adhesive. Also, the fixation of the component to the board is more dependable and permanent, providing long term protection from shock and vibration.

The mounting entity 24 can easily be fabricated by mating Scotch brand No. 4016 double coated urethane foam tape with Scotch brand No. 588 heat activated bonding tape. Other materials may also be used; however, the heat sensitive adhesive must be one which will activate at a temperature reachable by the top of the board, preferably during a wave soldering operation.

While there have been shown and described what are at present considered to be the preferred embodiment of the invention, it will be apparent to those skilled in the art that various changes and modifications can be made herein without departing from the scope of the invention as defined by the appended claims.

I claim:

1. The method of mounting an electrical component, comprised of a body having a major surface and having two lead-in wires extending from said body orthogonal to said major surface; and a mounting entity therefor, said mounting entity comprising, in layered order; a pressure sensitive adhesive affixed to said major surface; a flexible spacer attached to said pressure sensitive adhesive; and a heat sensitive adhesive attached to said spacer, upon a printed circuit board comprising the steps of: positioning said component upon a surface of said board with said lead-in wires penetrating said board, and said heat sensitive adhesive in contact with said surface of said board; and raising the temperature of said surface to a sufficient degree to activate said heat sensitive adhesive and fix said component to said board.

2. The method of claim 1 wherein said sufficient degree is about 150° F. to 200° F.

3. The method of claim 2 wherein said sufficient degree is achieved by contacting the opposite surface of said board with a solder wave having a temperature of above 500° F.

4. An electrical component comprising: a body having a major surface and having two lead-in wires extending from said body orthogonal to said major surface; and a mounting entity therefor, said mounting entity comprising, in layered order; a pressure sensitive adhesive affixed to said major surface; a flexible spacer attached to said pressure sensitive adhesive; and a heat sensitive adhesive attached to said spacer.

5. The component of claim 1 wherein said component is a quartz crystal resonator.

6. An electrical component comprising: a body having a major surface; and a mounting entity therefor, said mounting entity comprising, in layered order: a first pressure sensitive adhesive affixed to said major surface; a flexible spacer attached to said first pressure sensitive adhesive; a second pressure sensitive adhesive attached to said flexible spacer; a filler layer attached to said second pressure sensitive adhesive; and a heat sensitive adhesive attached to said filler layer.

7. A component mounting entity comprising, in layered order, a first pressure sensitive adhesive; a resilient foam having opposed surfaces; a first of said opposed surfaces being attached to said first pressure sensitive adhesive; a second pressure sensitive adhesive attached to the second of said opposed surfaces; a filler layer attached to said second pressure sensitive adhesive; and a heat sensitive adhesive attached to said filler layer.

* * * * *